(12) United States Patent
Chen

(10) Patent No.: US 7,023,734 B2
(45) Date of Patent: Apr. 4, 2006

(54) OVERERASE CORRECTION IN FLASH EEPROM MEMORY

(75) Inventor: Chung Zen Chen, Hsinchu (TW)

(73) Assignee: Elite Semiconductor Memory Technology, Inc., Hsinchu (TW)

( * ) Notice: Subject to any disclaimer, the term of this patent is extended or adjusted under 35 U.S.C. 154(b) by 132 days.

(21) Appl. No.: 10/792,121

(22) Filed: Mar. 3, 2004

(65) Prior Publication Data

US 2005/0195656 A1 Sep. 8, 2005

(51) Int. Cl.
*G11C 16/04* (2006.01)
(52) U.S. Cl. .................. 365/185.19; 365/185.29; 365/185.3; 365/185.33
(58) Field of Classification Search ........... 365/185.19, 365/185.29, 185.3, 185.33
See application file for complete search history.

(56) References Cited

U.S. PATENT DOCUMENTS

| | | | |
|---|---|---|---|
| 5,576,991 A | 11/1996 | Radjy et al. | |
| 5,642,311 A | 6/1997 | Cleveland et al. | |
| 5,822,252 A * | 10/1998 | Lee et al. | 365/185.3 |
| 6,023,426 A * | 2/2000 | Tang et al. | 365/185.3 |
| 6,046,932 A | 4/2000 | Bill et al. | |

* cited by examiner

*Primary Examiner*—Van Thu Nguyen
*Assistant Examiner*—Pho M. Luu
(74) *Attorney, Agent, or Firm*—Duane Morris LLP

(57) ABSTRACT

A method of overerase correction for memory cells in a memory array after the memory cells have been erased is provided comprising the following steps: (a) setting a gate voltage of memory cells from a first selected bit line exhibiting leakage current above a threshold value to an initial voltage level; (b) applying a series of overerase correction pulses to the first selected bit line during a selected time period; (c) detecting during the selected time period whether the bit line exhibits leakage current above the threshold value; (d) if the bit line exhibits leakage current above the threshold value after the selected time period, increasing the gate voltage and repeating steps (b) and (c); and (e) if it is detected that the bit line does not exhibit leakage current above the threshold value during the selected time period, selecting a second bit line and repeating steps (a) through (d).

25 Claims, 3 Drawing Sheets

OVERERASE CORRECTION IN FLASH EEPROM MEMORY

FIELD OF THE INVENTION

The present invention relates to an integrated circuit memory including an array of flash memory cells and circuitry to provide for overerase correction for the flash memory cells.

BACKGROUND OF THE INVENTION

FIG. 1 shows a typical configuration for an integrated circuit including a flash EEPROM memory array 100 and circuitry enabling programming, erasing, reading, and overerase correction for memory cells in the array 100. The flash EEPROM array 100 is composed of individual cells, such as cell 102. Each cell has a drain connected to a bitline, such as bit line 104, each bitline being connected to a bitline switch circuit 106 and column decoder 108. Sources of the array cells are connected to each other and VSL, which is the common source signal, while their gates are each connected by a wordline to a row decoder 110.

The row decoder 110 receives voltage signals from a power supply 112 and distributes the particular voltage signals to the wordlines as controlled by a row address received from a processor or state machine 114. Likewise, the bitline switch circuit 106 receives voltage signals from the power supply 112 and distributes the particular voltage signals to the bitlines as controlled by a signal from the processor 114. Voltages provided by the power supply 112 are provided as controlled by signals received from processor 114.

The column decoder 108 provides signals from particular bitlines to sense amplifiers or comparators 116 as controlled by a column address signal received from processor 114. The power supply 112 supplies voltages to column decoder 108 and bit lines 104. The sense amplifiers 116 further receive a signal from reference cells of reference array 118. With signals from the column decoder 108 and reference array 118, the sense amplifiers 116 then each provide a signal indicating a state of a bitline relative to a reference cell line to which it is connected through data latches or buffers 120 to processor 114.

To program a cell in the flash memory array 100, high gate-to-source voltage pulses are provided to the cell from power supply 112 while a source of the cell is grounded. For instance, during programming multiple gate voltage pulses typically of 10 V are each applied for approximately three to six microseconds to a cell, while a drain voltage of the cell is set to 4.5 V and its source is grounded. This 4.5 V bias from-drain to-source generates hot electrons near the drain side. The large gate-to-source voltage pulses enable a probability of hot electrons to overcome an energy barrier between the channel and floating gate formed by a thin dielectric layer, thereby driving hot electrons onto the floating gate of the cell. This programming procedure, termed "hot electron injection" results in an increase of a threshold voltage for the cell, the threshold being the gate-to-source voltage required for the cell to conduct.

To erase a cell in the flash memory array 100, a procedure known as Fowler-Nordheim tunneling is utilized wherein relatively high negative gate-to-source voltage pulses are applied for a few milliseconds each. For instance, during erase multiple gate voltage pulses of −10 V are applied to a cell, while a source of the cell is set to 5.5 V and its drain is floating. The large negative gate-to-source voltage pulses enable electrons to tunnel from the floating gate of a cell reducing its threshold.

In a flash memory array, all cells are typically erased simultaneously. Erasing of the memory cells is typically done by repeated applications of short erase pulses, described above, applied to each of the cells in the array, such as flash memory array 100. After each erase pulse, erase verify is performed cell by cell to determine if each cell in the array has a threshold above a limit, such as 3.0V, or if a cell is "undererased". During execution of erase verify, current is measured to assure all cells have thresholds below the 3.0V limit required for an erased cell as described above. If an undererased cell is detected, an additional erase pulse is typically applied to the entire array. With such an erase procedure, a cell that is not undererased will also be repeatedly erased, and its control gate may eventually acquire a threshold below zero volts. A cell with a threshold erased below 0.5 volts, and sometimes 0 V, is referred to as being overerased.

Overerased cells have a threshold voltage that is too low and provide leakage current even when the gate-to-source voltage is at 0V. The cell leakage will form a non-negligible bit line current, which leads to reading and programming errors. Therefore, overerase correction is performed to reduce this bit line current. During overerase correction, all of the cells on a bit line in the flash memory array 100 have the same gate-to-source voltage with the source grounded. The drain voltage of the cell is set to around 5V. Again, hot electrons will be injected into the floating gate to raise the threshold voltages of the cells.

During programming, the bit line current of a bit line is composed of a cell current with the cell biased at programming condition and any cell currents provided by the unselected cells from the bit line. In general, the unselected cells have the gate-to-source voltage at ground level. During overerase correction, the bit line current is composed of all of the cell currents coming from all of the cells connected to the bit line. If overerase correction is done by bit line, all of the cells have equal gate-to-source voltages. If the overerase correction is done by a cell, the selected cell will have a different gate-to-source voltage from the other cells.

To represent a data bit, the floating gate of a cell is programmed or erased as described above. In a programmed state, the threshold voltage of a cell is typically set at greater than 5.0 volts, while the threshold voltage of a cell in an erased state is typically limited below 3.0 volts. To read a cell, a control gate voltage between 3.0 and 6.5 volts, typically 5 V, is applied. The 5 V read pulse is applied to the gate of an array cell as well as a cell in reference array 118 having a threshold near 3.5 V. In a programmed state with an array cell in array 100 having a threshold above 5.0 V, current provided by the reference cell with a threshold of 3.5 V will be greater indicating a programmed cell exists. In an erased state with a threshold of a cell in array 100 below 3.0 V, current provided by the array cell will be greater than the reference cell with a threshold of 3.5 V indicating an erased cell. To verify programming or erase, a read voltage is similarly applied to both a cell in the array and to cells in the reference array 118. For programming, a reference cell having a threshold of 5.0 V is used for a comparison, while for erase, a reference cell having a threshold of 3.0 V is used for comparison.

Overerased cells are undesirable because they create bit line leakage current during program or read procedures. For instance, during program or read, only one word line carries a positive voltage, while the remaining word lines are typically grounded. With word lines grounded, or at 0 V, a cell with a threshold voltage below about 0.5 V will conduct cell leakage current. A small leakage current in each cell will generate a non-negligible bit line leakage current since a bit line may have as many as, for example, 512 cells connected thereto. This leakage current will be enlarged one order of magnitude at high operating temperatures if the over-erased cell is operated in the sub-threshold region. With bit line leakage current, power supplies providing power to a bit line during programming may become overloaded. Similarly, with bit line leakage current during read, read errors may occur.

To prevent overerase, manufacturers of integrated circuits containing flash memory cells provide an overerase correction mechanism that typically seeks to "soft program" the overerased cells and raise their threshold voltages to a lower limit. Converging threshold voltages after erase prevents leakage current from overerased cells from causing read and program errors. U.S. Pat. No. 5,642,311 to Cleveland et al. provides a circuit for sensing overerased cells and applying programming pulses thereto that bring their threshold voltages back up to acceptable values. The circuit of Cleveland et al. uses ground level for the word line voltage and 5V on the bit line for overerase correction pulses. The approach of Cleveland et al. cannot provide sufficient bit line voltage as the bit line leakage current grows. FIG. 2 is a circuit schematic illustrating a single bit line 104, cell 102 and programming circuitry therefor. If power supply voltage VCC is lower than 5V, such as 3V or lower, charge pumping is required to pump the bit line voltage VBL above 3V during program and overerase correction. Charge pumps are typically utilized in low power devices, such as 3V devices currently utilized with battery powered notebook computers having flash memory arrays. The charged pumping capability must be large enough to sustain the bit line leakage current for efficient overerase correction. FIG. 2 illustrates the path of current I from PMOS QP0 passing through a bit line 104 to a cell 102 during overerase correction. VDQ1 is the output of the charge pumping circuit. If VCC is high enough, the charge pumping circuit is not needed. VDQ2 is the regulated voltage, which is the targeted bit line voltage during overerase correction. VR is the bandgap reference voltage provided to the differential amplifier 122, which regulates VDQ2 to VR*((Ra+Rb)/Ra) since VD=VR and VD= VDQ2*(Ra/(Ra+Rb)). If the bit line leakage current becomes greater than the pumping current, VDQ1 and VDQ2 will drop below the target value, making overerase correction inefficient. A bit switch 124 is selected by the column decoder to turn on the electrical path from VDQ2 to the selected bit line 104. In FIG. 2, the bit switch 124 includes pass transistors Qbs0, Qbs1, and Qbs2. There is a voltage drop across each pass transistor that further reduces the value of VBL below its target value, such that VBL equals VDQ2−(I*Req) where Req is the equivalent resistance of bit switch 124 and PMOS QPL[n] and I is the bit line current. PMOS QPLn is an I/O switch transistor associated with a plurality of bit lines for selecting a group of bit lines associated with an I/O for writing. The voltage drop across bit switch 124 increases as current in bit line 104 increases.

U.S. Pat. No. 6,046,932 to Bill et al. proposes a solution to problems associated with Cleveland et al. and described above. A resistor is connected in series between the source of the cell and ground. The leakage current raises the source voltage and forces deselected cells to have lower leakage currents by the self-generated body effect. This method is applied to programming and overerase correction. The drain to source voltage will be lower than VDQ2. In order to have efficient over erase correction or programming, VDQ2 will be set at a higher target value to sustain the drain to source voltage at high enough level. However, when the bit line leakage current is reduced, the voltage drop on the resistor is reduced, and the drain to source voltage is increased and approaches VDQ2. The variation of the drain-to-source voltage maybe as high as 1V. At this time, the drain to source voltage may become too high, which will create more hot holes that damage the Si—SiO$_2$ interface of the memory cell. The result is the degradation of program/erase cycling reliability.

Therefore, there remains a need for a method and circuit for controlling the bit line current during overerase correction operation and for more efficiently performing overerase correction.

SUMMARY OF THE INVENTION

A method of overerase correction for memory cells in a memory array after the memory cells have been erased is provided comprising the following steps: (a) setting a gate voltage of memory cells from a first selected bit line exhibiting leakage current above a threshold value to an initial voltage level; (b) applying a series of overerase correction pulses to the first selected bit line during a selected time period; (c) detecting during the selected time period whether the bit line exhibits leakage current above the threshold value; (d) if the bit line exhibits leakage current above the threshold value after the selected time period, increasing the gate voltage and repeating steps (b) and (c); and (e) if it is detected that the bit line does not exhibit leakage current above the threshold value during the selected time period, selecting a second bit line and repeating steps (a) through (d).

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

Provided herein is a method for providing overerase correction to memory cells in a memory array. In one embodiment, the memory array comprises flash memory cells. The method controls the current flow through a bit line during overerase correction thereby keeping the bit line voltage during overerase correction at an adequate level for overerase correction.

Figure 1:
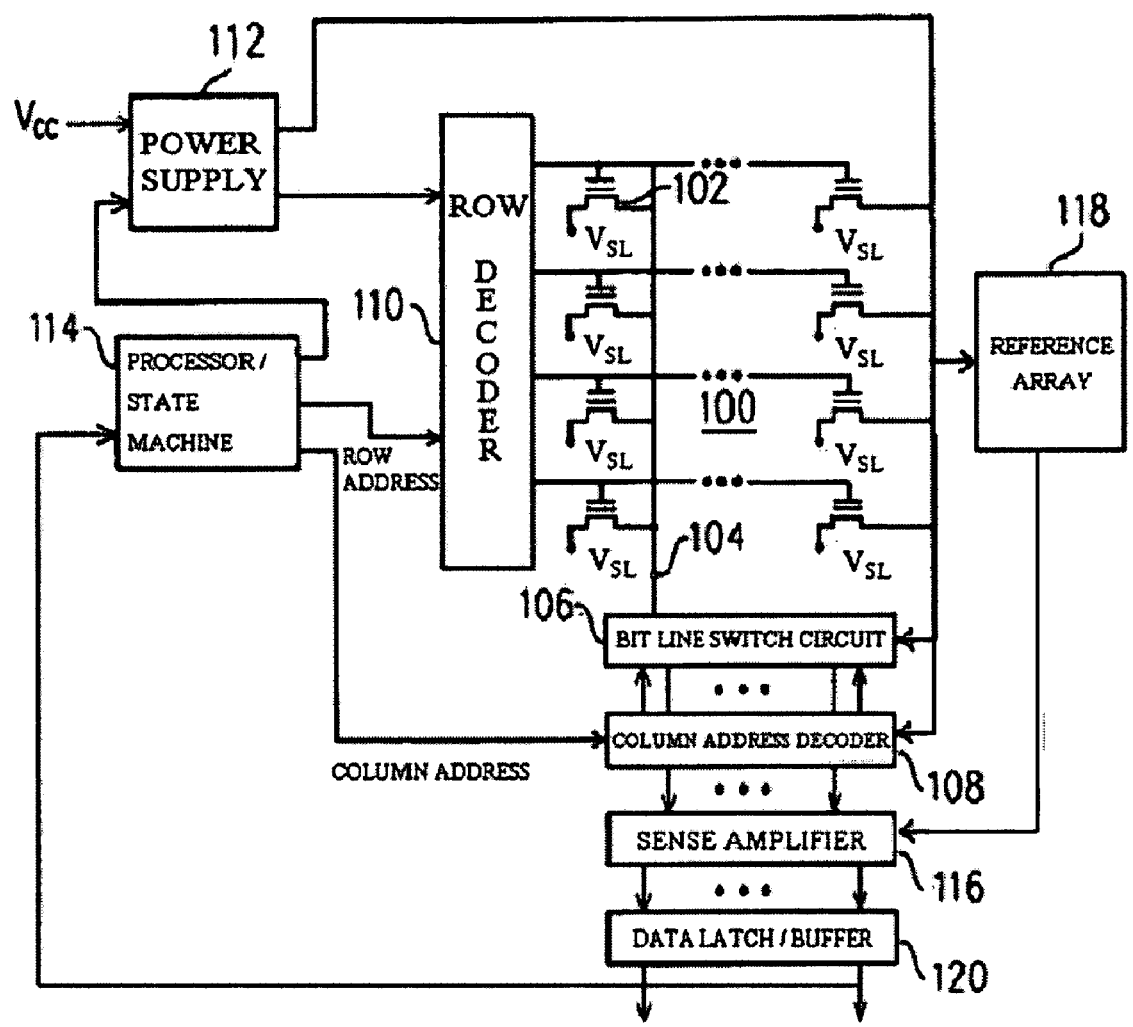
FIG. 1 shows a typical prior art configuration for an integrated circuit including a flash EEPROM memory array and circuitry enabling programming, erasing, reading and overerase correction in the array.
Figure 2:
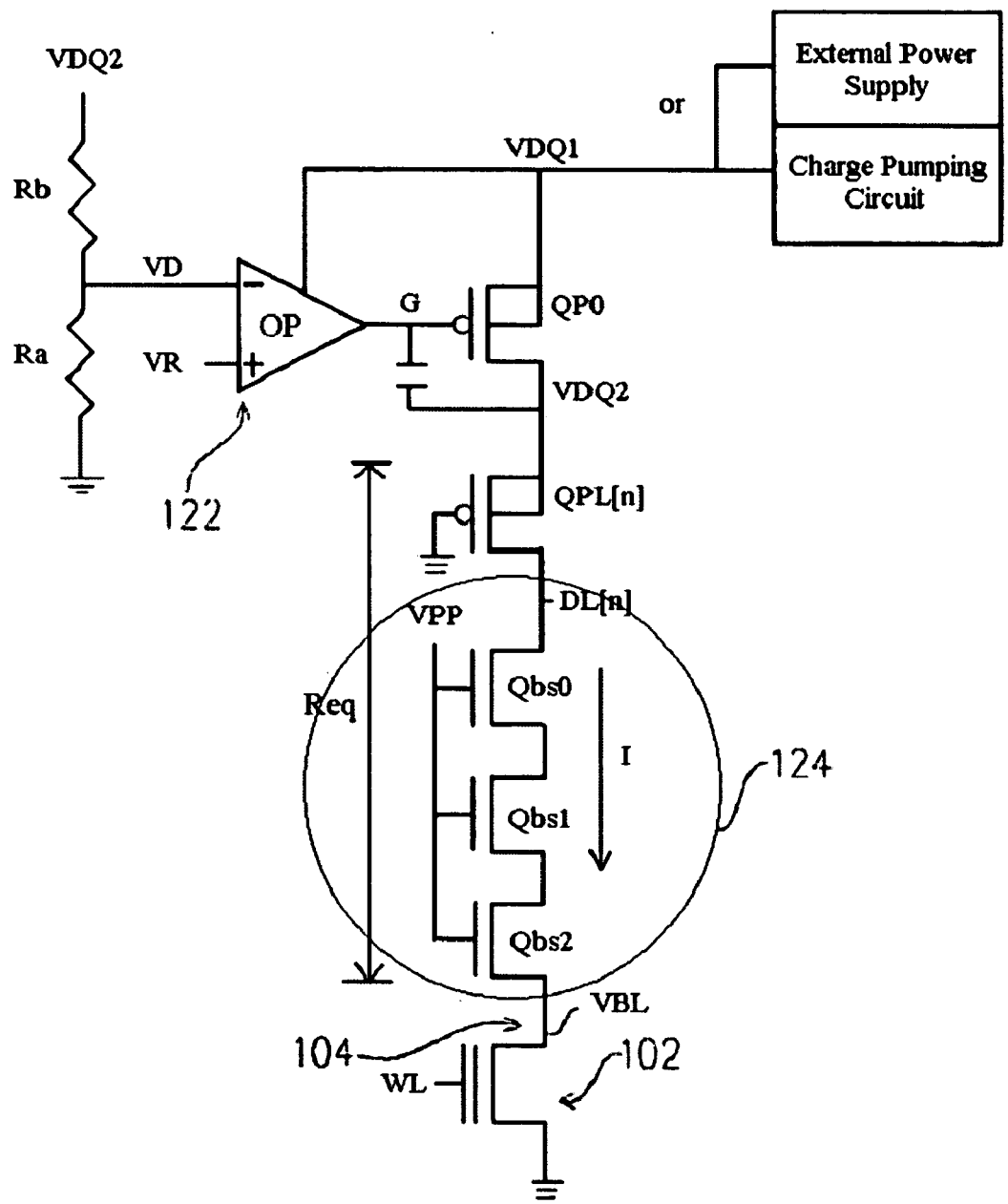
FIG. 2 illustrates circuitry for providing programming and overerase correction to a bit line in a memory array.
Figure 3:
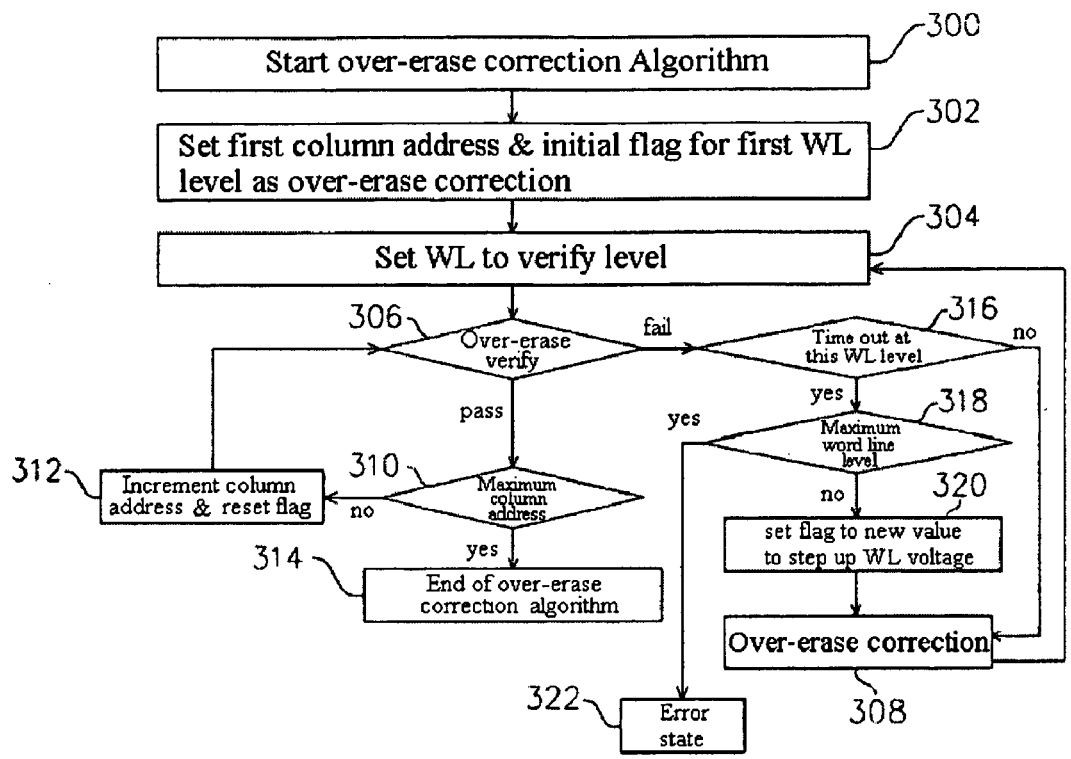
FIG. 3 is a flow diagram of an exemplary overerase correction method.

An exemplary embodiment of the overerase correction method is shown in the flow chart of FIG. 3. At step 300, the overerase correction algorithm is begun. The overerase correction method is preferably applied to a plurality of bit lines in a memory array, and in one embodiment, overerase correction is applied to the bit lines one bit line at a time from a selected I/O. Therefore, at step 302, the column address of the column decoder is set to correspond to a first selected bit line from the memory array, thereby selecting the first bit line for overerase correction. As also shown in FIG. 3, a flag (or other indicia) is set corresponding to a first or initial voltage to be applied to the word lines of each cell in the selected bit line. This initial value and subsequent values (as described below) may be selected based on the specific design of the memory cells and the array. In one embodiment, the initial value of the word line voltage is set to a negative value and is positively incremented in steps to a maximum value. In one embodiment, the initial voltage is set to −2.0V and is incremented in four steps of 0.5V to a maximum voltage of 0 V. It should be understood, however, that the selection of voltage values applied on the word line during overerase correction depends on the used cell characteristics. The incrementing step is described below in connection with step 320.

At step 304, the word line voltage WL is set to a verify level used to determine if the cells in the selected bit line are overerased, i.e., if the bit line has a leakage current beyond the selected verify tolerance. The verify level on a selected word line can be 0 V or a higher voltage to ensure that the bit line leakage current is low. At step 306, it is determined whether any cells in the selected bit line are overerased. During this step, the total leakage current of the bit line is tested. The verify step may be accomplished by grounding the word lines, applying typically 1.0 volt to address the selected bit line and sensing the bit line current. If the bit line current is above a predetermined value, this indicates that at least one of the cells connected to the bit line is overerased and is drawing leakage current. If no cells in the selected bit line are determined to be overerased, the column address is checked at step 310 to determine if the column address corresponding to the last bit line from the memory array or sector of the memory array to be overerase corrected has been reached. If the last column address has been reached, meaning all bit lines to be overerase corrected have been processed, the overerase correction process ends (step 314). If the maximum column address has not been reached at step 310, the column address is incremented to the next column address and the overerase correction voltage flag is reset to the initial value (step 312). The overerase verify step 306 is then repeated with respect to the newly selected bit line.

If it is determined at step 306 that the selected bit line is "leaky," meaning the bit line has leakage current larger than the allowable value set by the reference cell current during verification (i.e., a threshold value), the method checks to see if a time limit for the first stage of overerase correction has been reached (step 316). The bit line leakage current may be composed of a single cell or a few cells with severe overerase, or many cells with lighter overerase, or a combination thereof. Each word line voltage level applied for overerase correction is associated with an overerase correction "stage" for purposes of this embodiment. In one embodiment, each stage preferably lasts between about 20–100 milliseconds (ms), and more preferably about 50 ms. A timer in a timing circuit is started for each stage, such as once the first overerase correction pulse is applied for each stage (step 308). If the time period has not expired at step 316, an overerase correction pulse is applied to the drains of memory cells in the selected bit line (step 308) with the word line voltage of each cell set to the voltage level identified by the word line voltage level flag. The time period can be a set period of time or a set number of pulses (or even a combination thereof). For example, rather than monitor an actual time for expiration, the method can monitor the number of overerase correction pulses applied. e.g., a time period may comprise 5 pulses. For purposes of this embodiment, "selected time period" means a selected period of time or a selected number of pulses. In this first pass through the overerase correction algorithm, the word line voltage is set to the initial word line voltage level (e.g., −2.0V).

In one embodiment, the overerase correction pulses applied at step 308 range from about 0.5 to 2.0 ms, and preferably about 1.0 ms.

After application of a pulse at step 308, the word line voltage is set to the verify level (step 304), and the bit line is tested for the presence of overerased cells at step 306. Collectively, the total number of pulses that may be applied during a selected time period is referred to as "series of pulses." If it is determined that the bit line is not leaky, the algorithm proceeds to step 310 as described above. If the bit line is still leaky (i.e., the overerase correction step 308 was not sufficient to correct the overerase condition), the timer is again checked at step 316. If the timer has not expired, another overerase correction pulse or series of pulses is applied at step 308 with the word line voltage level again set to the level identified by the word line voltage level flag. This loop (steps 316, 308, 304, 306) is repeated until it is determined that the bit line is not leaky (step 306) or the time expires (step 316). If the time expires at step 316, it is checked at step 318 whether the maximum word line voltage has been reached, i.e., whether the word line voltage flag is set to the highest allowed word line voltage.

If the highest allowed word line voltage has been reached (as determined at step 318), an error flag is set at step 322, indicating that the bit line still includes at least one overerased cell, and the overerase correction algorithm is completed. A cell may not be corrected, for example, under conditions of severe overerase. Each bit line has its bit switch driven by the column decoder. These bit switches have limited transistor size. If the bit line leakage current is large, the voltage drop on these bit switches is not negligible, dropping the drain-to-source voltage to a low level. This level cannot support efficient overerase correction, leading to overerase correction failure.

If the maximum word line voltage level has not been reached at step 318, the word line voltage flag is set, at step 320, to identify the second (or next) incremental voltage level for the word line voltage. For example, as described above, the initial word line voltage value during overerase correction may be −2.0V. This value may be incremented in increments of 0.5V until a maximum value of 0V is reached. In this embodiment, the first incrementing step 320 increments the word line voltage flag to represent −1.5V. The timer is also reset and started at step 320. Overerase correction is then performed at step 308, i.e., the word line voltage is set to the value indicated by the word line voltage flag and an overerase correction pulse or series of pulses is provided to the drain terminals of the memory cells in the selected bit line. The verify procedures (steps 304 and 306) and other steps indicated in FIG. 3 are then performed as described above.

The algorithm of FIG. 3 converges the threshold voltages of a selected bit line toward the desired threshold voltage when an overerased cell is detected in the bit line while preventing a large total leakage current from flowing in the bit line. Further, because the overerase states of the cells are checked after each overerase correction pulse before incrementing the word line voltage to the next level, the algorithm avoids the application of unnecessary or superfluous pulses, providing for a time and energy efficient overerase correction method while still incrementing the word line voltage when necessary.

From the foregoing, a method of, and structure for, overerase correction for memory cells in a memory array after the memory cells have been erased is provided comprising the following steps: (a) setting a gate voltage of memory cells from a first selected leaky bit line to an initial voltage level; (b) applying a series of overerase correction pulses to the first selected leaky bit line during a selected time period; (c) detecting during the selected time period whether the bit line is leaky; (d) if the bit line is still leaky after the selected time period, increasing the gate voltage and repeating steps (b) and (c); and (e) if it is detected that the bit line is not leaky during the selected time period, selecting a second bit line and repeating steps (a) through (d).

Figure 4:
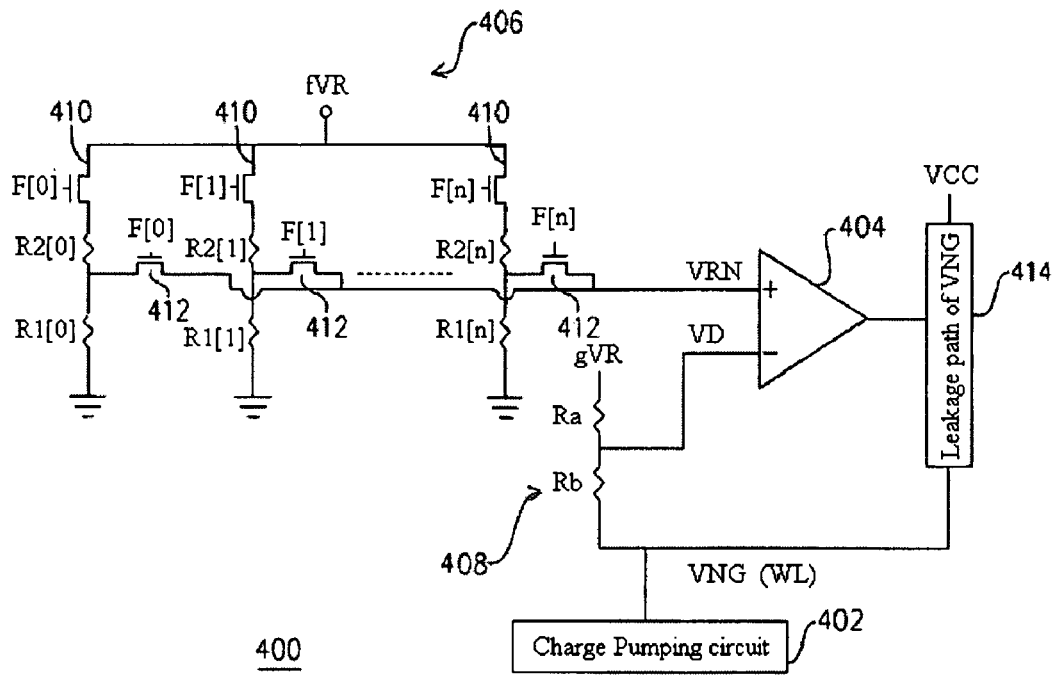
FIG. 4 is a circuit schematic of an embodiment of a circuit for supplying the word line voltages to the memory cells during overerase correction.

Referring now to FIG. 4, a circuit 400 is provided for supplying the word line voltages to the cells for overerase correction. The word line voltage is labeled VNG (WL) in FIG. 4. The circuit 400 is configured to provide an initial negative word line voltage that is then positively incremented when needed as discussed above during the overerase correction algorithm of FIG. 3. Certainly, other circuits may be used to provide the stepped word line voltages. For example, the tunable resistance ladder 406 can be replaced with other tunable resistance circuit configurations. Circuit 400 includes a charge pumping circuit 402 for generating negative voltage VNG. A bandgap reference voltage VR is generated by a band gap reference circuit (not shown). Voltage VR can be multiplied to a higher level to input to the differential amplifier. Voltage fVR is the reference voltage VR multiplied by "f" times and fed to a differential amplifier, shown as comparator 404, through a first resistor divider 406. The number "f" may vary according to designs, but in one embodiment is between about 1–3, and is preferably set to 2. Voltage gVR is the reference voltage VR multiplied by "g" and fed to the comparator 404 through a second resistor divider 408. The number "g" may vary according to designs, but in one embodiment is between about 1 to 3 and is preferably about 2. In one embodiment fVR and gVR are generated by voltage regulator circuits and VR is set to about 1.2V.

The comparator 404 has input voltages labeled VRN (the output of first resistor divider 406) and VD (the output of second resistor divider 408). Voltage VRN is set by the signals F[0:n], which each correspond to a respective world line voltage flag discussed above. The value of VRN is equal to fVR*R1[k]/(R1[k]+R2[k]) where "k" is selected from o:n and corresponds to an overerase stage discussed above. VRN is equal to VD at a regulated state, i.e., if VD does not equal VRN, the circuit of FIG. 4 forces VD to equal VRN. VD is equal to (gVR−VNG)*(Rb/(Ra+Rb))+VNG. In one embodiment, the resistors Ra and Rb are formed from polysilicon strips or p+ diffusion regions to allow for the negative bias VNG. The N-well surrounding the p+ diffusion regions should be tied to gVR or a higher voltage level.

In the embodiment of FIG. 4, only one of F[0:n] (i.e., F[k]) is active during any one overerase correction stage. In one embodiment, F[0:n] corresponds to the word line voltage flag and may be generated or supplied from a shift register. The number of incremental word line voltages that may be used during overerase correction is represented by n+1. In the embodiment of FIG. 4, F[0] is set to a logical one and F[1] through F[n] are set to logical zeros during the first stage of overerase correction, i.e., when the word line voltage is to be set to its initial value during overerase correction. With F[0] set to a logical one, the corresponding switches 410 and 412 coupled to F[0] are on, while all other switches 410 and 412 are off, thereby connecting voltage fVR to the positive node of comparator 404 through the resistive branch comprising resistors R1[0] and R2[0]. During the second stage (i.e., after the timeout of the first stage), F[0] and F[2] through F[n] are set to zeroes and F[1] is set to a logical one, until the second stage times out (step 316) or overerase correction is verified (step 306). With F[1] set to a logical one and the remaining signals set to logical zero, the corresponding switches 410 and 412 coupled to F[1] are on, while all other switches 410 and 412 are off, thereby connecting voltage fVR to the positive node of comparator 404 through the resistive branch comprising resistors R1[1] and R2[1]. F[n] is set to a logical one and F[0] through F[n−1] are set to zeros during the final stage of overerase correction when the word line voltage is set to its maximum value (if the correction algorithm gets that far for a given overerase correction for a bit line). From the foregoing, there are a total of n+1 cycles of overerase correction in this example. Each respective R1[0:n] and R2 [0:n] is selected to provide a voltage VRN, when the stage's respective switches 410, 412 are triggered by signals F[0:n], that forces voltage VD to drive the desired word line voltage (VNG (WL)) for the stage to a desired, preselected value (e.g., either −2.0V, −1.5V, −1.0V, −0.5V, or 0V in one embodiment).

As described above, the circuit 400 forces VD to be equal to VRN. Since VRN is connected to the positive node of the differential amplifier 404, the output of the amplifier 404 will be high when VRN is larger than VD. This means that VNG is too negative. The leakage path 414 is turned on to pull up VNG so that VD becomes equal to VRN. In one embodiment, the leakage path 414 is formed by PMOSFET and/or triple well NMOSFETs connected in series. The differential amplifier will output a low when VRN is smaller than VD. This means that VNG is too positive and the leakage path will be turned off, lowering VNG to bring the value of VD to the value of VRN.

Because circuit 400 forces the condition VRN=VD, it is known that (R1[k]/(R1[k]+R2[k]))*fVR=(Rb/(Ra+Rb))* (gVR−VNG)+VNG. Voltage VNG, therefore, is equal to (((R1[k]/(R1[k]+R2[k]))*fVR)−(Rb/(Ra+Rb))*gVR)*(Ra+Rb)/Ra. Selecting the number of stages (and thus n) and the value of VNG for each stage allows the designer to select and solve for VR, Ra, Rb R1[0:n] and R2[0:n]. The circuit 400, therefore, provides great design flexibility.

Following is an example for the selection of fVR, gVR, and R1[K]/(R1[K]+R2[K]) with Ra/(Ra+Rb)=0.25 and n=4.

| k | VNG | gVR | VD | fVR | R1[k]/(R1[k] + R2[k]) |
|---|---|---|---|---|---|
| 0 | 0 V | 2 V | 1.5 V | 2 V | 0.75 |
| 1 | −0.5 V | 2 V | 1.375 V | 2 V | 0.6875 |
| 2 | −1 V | 2 V | 1.25 V | 2 V | 0.625 |
| 3 | −1.5 V | 2 V | 1.125 V | 2 V | 0.5625 |
| 4 | −2 V | 2 V | 1 V | 2 V | 0.5 |

From the foregoing, a method of, and structure for, overerase correction for memory cells in a memory array after the memory cells have been erased is provided comprising the following steps: (a) setting a gate voltage of memory cells from a first selected leaky bit line to an initial voltage level; (b) applying a series of overerase correction pulses to the first selected leaky bit line during a selected time period; (c) detecting during the selected time period whether the bit line is leaky; (d) if the bit line is still leaky after the selected time period, increasing the gate voltage and repeating steps (b) and (c); and (e) if it is detected that the bit line is not leaky during the selected time period, selecting a second bit line and repeating steps (a) through (d).

A semiconductor device is also provided comprising a memory array including a plurality of memory cells disposed in a plurality of bit lines, the semiconductor device comprising circuitry for overerase correction of the memory cells after the memory cells have been erased. In one embodiment, the circuitry comprises (a) means for setting a gate voltage of memory cells from a first selected leaky bit line to an initial voltage level. The gate voltage setting means may include, for example, a regulated voltage source that is responsive to a flag or other indicia representing the initial gate voltage for overerase correction. The circuitry may also include (b) means for applying a series of overerase correction pulses to the first selected leaky bit line during a selected time period. The overerase correction pulse applying means may include a voltage source for applying the desired overerase correction pulse voltage to the bit line and timing circuitry for controlling the length of the pulses. The overerase correction circuitry also includes (c) means for detecting during the selected time period whether the bit line is leaky. The detecting means may include overerase verify circuitry described above and a timer circuit for running the time period. In this embodiment, the correction circuitry also includes (d) means for, if the bit line is still leaky after the selected time period, increasing the gate voltage and repeating the functions of means (b) and (c). The increasing means may include, for example, a regulated voltage source such as shown in FIG. 4 responsive to a control signal indicating if the bit line is still leaky after the time period. Last, the overerase correction circuitry in this embodiment may include (e) means for, if it is detected that the bit line is not leaky during the selected time period, selecting a second bit line and repeating the functions of means (a) through (d). In one embodiment, the selecting and repeating means may include means (a) through (d) discussed above, verify circuitry for checking the overerase status of a bit line, a register for storing and incrementing the column address of bit lines in the memory sector to be overerase corrected, and column address selection circuitry for selecting the bit line.

The method and circuit described above control the current flowing through a bit line during overerase correction and keep the bit line voltage at an adequate level for efficient overerase correction. In one embodiment, by initially applying a negative gate voltage during overerase correction, a significant reduction in leakage current is achieved. With a negative gate voltage, even overerased cells will not conduct if their thresholds are above the negative gate voltage. With fewer overerased cells conducting, less current is required for convergence. This provides particular benefits if the bit line voltage needs to be pumped by a charge pump to raise the integrated circuit's VCC level during threshold convergences as may be required in low power devices. Further, checking the overerase state of the cells of a selected bit line after each overerase correction pulse or set number of pulses before incrementing the word line voltage to the next level avoids the application of unnecessary or superfluous pulses, providing for a time and energy efficient overerase correction method while still incrementing the word line voltage when necessary.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A method of overerase correction for memory cells in a memory array after the memory cells have been erased, comprising the following steps:
   (a) setting a gate voltage of memory cells from a first selected bit line exhibiting leakage current above a threshold value to an initial voltage level;
   (b) applying a series of overerase correction pulses to said first selected bit line during a selected time period;
   (c) detecting during said selected time period whether said bit line exhibits leakage current above said threshold value;
   (d) if said bit line exhibits leakage current above said threshold value after said selected time period, increasing said gate voltage and repeating steps (b) and (c); and
   (e) if it is detected that said bit line does not exhibit leakage current above said threshold value during said selected time period, selecting a second bit line and repeating steps (a) through (d).

2. The method of claim 1, wherein said selected time period is between about 20–100 milliseconds.

3. The method of claim 1, wherein each overerase correction pulse from said series of overerase correction pulses is applied for between about 0.5–2.0 milliseconds.

4. The method of claim 1, wherein step (c) comprises the following step:
   detecting after each overerase correction pulse whether said bit line exhibits leakage current above said threshold value.

5. The method of claim 1, further comprising the step of setting an error flag if said gate voltage has reached a maximum gate voltage value.

6. The method of claim 1, wherein said initial voltage level is a negative voltage.

7. The method of claim 6, wherein said initial voltage level is approximately −2.0 V and step (d) includes the step of positively incrementing said gate voltage in increments of about 0.5 V.

8. A semiconductor device comprising a memory array including a plurality of memory cells disposed in a plurality of bit lines, said semiconductor device comprising circuitry for overerase correction of said memory cells after the memory cells have been erased, said circuitry comprising:
   (a) means for setting a gate voltage of memory cells from a first selected bit line that exhibits leakage current above a threshold value to an initial voltage level;
   (b) means for applying a series of overerase correction pulses to said first selected bit line during a selected time period;
   (c) means for detecting during said selected time period whether said bit line exhibits leakage current above said threshold value;
   (d) means for, if said bit line exhibits leakage current above said threshold value after said selected time period, increasing said gate voltage and repeating the functions of means (b) and (c); and
   (e) means for, if it is detected that said bit line does not exhibit leakage current above said threshold value during said selected time period, selecting a second bit line and repeating the functions of means (a) through (d).

9. The device of claim 8, wherein said selected time period is between about 20–100 milliseconds.

10. The device of claim 8, wherein each overerase correction pulse from said series of overerased correction pulses is applied for between about 0.5–2.0 milliseconds.

11. The device of claim 8, wherein means (c) comprises means for detecting after each overerase correction pulse whether said bit line exhibits leakage current above said threshold value.

12. The device of claim 8, further comprising means for setting an error flag if said gate voltage has reached a maximum gate voltage value.

13. The device of claim 8, wherein said initial voltage level is a negative voltage.

14. The device of claim 13, wherein said initial voltage level is approximately −2.0 V and means (d) includes means for positively incrementing said gate voltage in increments of about 0.5 V.

15. The device of claim 13, further comprising means for positively incrementing said gate voltage to a maximum gate voltage.

16. The device of claim 15, wherein said incrementing means comprises:
    a comparator, said comparator having:
        a first voltage input coupled to a tunable resistance circuit, said tunable resistance circuit configurable responsive to a word line voltage control signal; and
        a second voltage input coupled to a second resistance circuit;
    said second resistance circuit coupled to a voltage source for providing said word line voltage,
    wherein an output of said comparator regulates an output of said voltage source responsive to a voltage signal at said first voltage input.

17. The device of claim 16, wherein an output of said comparator is coupled to an output of said voltage source through a leakage path.

18. The device of claim 8, wherein said memory array is a flash memory array.

19. A method of overerase correction for memory cells in a flash memory array after the memory cells have been erased, comprising the following steps:
    (a) setting a gate voltage of memory cells from a first selected bit line exhibiting leakage current above a threshold value to an initial voltage level, said initial voltage level being a negative voltage;
    (b) applying a series of overerase correction pulses to said first selected bit line during a selected time period;
    (c) detecting during said selected time period after each overerase correction pulse from said series of correction pulses whether said bit line exhibits leakage current above said threshold value;
    (d) if said bit line exhibits leakage current above said threshold value after said selected time period, incrementing said gate voltage to a second voltage level and repeating steps (b) and (c); and
    (e) if it is detected that said bit line does not exhibit leakage current above said threshold value during said selected time period, selecting a second bit line and repeating steps (a) through (d).

20. The method of claim 19,
    wherein said selected time period is between about 20–100 milliseconds, and
    wherein each overerase correction pulse from said series of overerase correction pulses is applied for between about 0.5–2.0 milliseconds.

21. The method of claim 20, wherein said initial voltage level is approximately −2.0 V and step (d) includes the step of positively incrementing said gate voltage in increments of about 0.5 V.

22. The method of claim 21, further comprising the step of detecting whether said gate voltage has reached a maximum gate voltage value.

23. The method of claim 22, wherein said maximum gate voltage is about 1.0V.

24. A semiconductor device comprising a memory array including a plurality of memory cells disposed in a plurality of bit lines, said semiconductor device comprising circuitry for overerase correction of said memory cells after the memory cells have been erased, said circuitry comprising:
    a source of overerase correction pulses to be applied during a selected time period;
    an overerase verify circuit, said verify circuit detecting whether a selected bit line exhibits leakage current above a threshold value during said selected time period;
    a gate voltage source, said gate voltage source responsive to a control signal representing a gate voltage from a plurality of gate voltages to be applied to said memory cells from said selected bit line during application of said overerase correction pulses; and
    a bit line selection circuit, said bit line selection circuit responsive to a control signal indicating if it has been detected during said selected time period if said selected bit line exhibits leakage current above said threshold value.

25. A method of overerase correction for memory cells in a memory array after the memory cells have been erased, comprising the following steps:
    (a) setting a gate voltage of memory cells from a first selected bit line including an overerased memory cell to an initial voltage level;
    (b) applying a series of overerase correction pulses to said first selected bit line during a selected time period;
    (c) detecting during said selected time period whether said bit line includes an overerased memory cell;
    (d) if said bit line includes an overerased memory cell after said selected time period, increasing said gate voltage and repeating steps (b) and (c); and
    (e) if it is detected that said bit line does not include an overerased memory cell during said selected time period, selecting a second bit line and repeating steps (a) through (d).

* * * * *